United States Patent
Zaman et al.

(10) Patent No.: US 7,876,276 B1
(45) Date of Patent: Jan. 25, 2011

(54) ANTENNA NEAR-FIELD PROBE STATION SCANNER

(75) Inventors: Afroz J. Zaman, Strongsville, OH (US); Richard Q. Lee, Ann Arbor, MI (US); William G. Darby, Litchfield, OH (US); Philip J. Barr, Schiller Park, IL (US); Kevin M Lambert, North Royalton, OH (US); Felix A. Miranda, Olmsted Falls, OH (US)

(73) Assignee: The United States of America as represented by the Administrator of the National Aeronautics and Space Administration, Washington, DC (US)

(*) Notice: Subject to any disclaimer, the term of this patent is extended or adjusted under 35 U.S.C. 154(b) by 1211 days.

(21) Appl. No.: 11/499,982

(22) Filed: Aug. 2, 2006

(51) Int. Cl.
*G01R 29/10* (2006.01)
(52) U.S. Cl. ..................... 343/703
(58) Field of Classification Search .............. 343/703
See application file for complete search history.

(56) References Cited

U.S. PATENT DOCUMENTS

| | | | | |
|---|---|---|---|---|
| 4,704,614 | A | 11/1987 | Poirier et al. | 343/703 |
| 5,270,723 | A | 12/1993 | Lopez et al. | 343/703 |
| 5,365,241 | A | 11/1994 | Williams et al. | 343/703 |
| 5,394,157 | A | 2/1995 | Garneski | 342/360 |
| 5,410,319 | A | 4/1995 | Lopez et al. | 342/360 |
| 5,477,229 | A | 12/1995 | Caille et al. | 342/360 |
| 5,485,158 | A | 1/1996 | Mailloux et al. | 342/165 |
| 5,844,414 | A | 12/1998 | Eriksson et al. | 324/627 |
| 6,181,285 | B1 | 1/2001 | Sullivan et al. | 343/703 |
| 6,191,744 | B1 | 2/2001 | Snow et al. | 343/703 |
| 6,249,248 | B1 | 6/2001 | Kitayoshi | 342/360 |
| 6,285,330 | B1 | 9/2001 | Perl | 343/703 |
| 6,329,953 | B1 * | 12/2001 | McKivergan | 343/703 |
| 6,459,409 | B1 | 10/2002 | Kohno et al. | 342/423 |
| 6,570,539 | B1 | 5/2003 | Snow et al. | 343/703 |
| 6,636,173 | B2 | 10/2003 | Graham | 342/174 |
| 7,035,594 | B2 | 4/2006 | Wallace et al. | 455/67.12 |

(Continued)

OTHER PUBLICATIONS

Measurement of Near Fields of Antennas and Scatterers, by John Dyson, IEEE Transactions on Antennas and propagation, vol. AP-21, No. 4, Jul. 1973.

(Continued)

*Primary Examiner*—Douglas W Owens
*Assistant Examiner*—Dieu Hien T Duong
(74) *Attorney, Agent, or Firm*—Robert H. Earp, III (57) ABSTRACT

A miniaturized antenna system is characterized non-destructively through the use of a scanner that measures its near-field radiated power performance. When taking measurements, the scanner can be moved linearly along the x, y and z axis, as well as rotationally relative to the antenna. The data obtained from the characterization are processed to determine the far-field properties of the system and to optimize the system. Each antenna is excited using a probe station system while a scanning probe scans the space above the antenna to measure the near field signals. Upon completion of the scan, the near-field patterns are transformed into far-field patterns. Along with taking data, this system also allows for extensive graphing and analysis of both the near-field and far-field data. The details of the probe station as well as the procedures for setting up a test, conducting a test, and analyzing the resulting data are also described.

14 Claims, 6 Drawing Sheets

U.S. PATENT DOCUMENTS

| | | | |
|---|---|---|---|
| 2002/0027526 A1 | 3/2002 | Kohno et al. | 342/418 |
| 2002/0171583 A1 | 11/2002 | Purdy et al. | 342/368 |
| 2003/0038747 A1* | 2/2003 | Patel et al. | 342/368 |
| 2003/0117315 A1 | 6/2003 | Graham | 342/174 |
| 2004/0155824 A1 | 8/2004 | Nagashima | 343/703 |
| 2005/0046608 A1 | 3/2005 | Schantz et al. | 342/127 |
| 2005/0253762 A1* | 11/2005 | Tsai et al. | 343/703 |

OTHER PUBLICATIONS

Determination of Far-Field Antenna Patterns From Near-Field Measurements by Johnson et al; Proceedings of the IEEE, vol. 61, No. 12, Dec. 1973.

* cited by examiner

PROBE STATION ANTENNA RANGE

Movement  [↕]  [5.00]  mm or degrees

|   |   |   |   |   |
|---|---|---|---|---|
| X | LEFT | RIGHT | HOME | Jogging ☐ |
| Y | FRONT | BACK | Freeze as Home | Homing ☐ |
| Z | UP | DOWN |  | Scanning ☐ |
| ROTATION | CCW | CW | Microscope |  |

#                                    mm X Axis Data Points [20]  X Axis Data Interval [3]

Y Axis Data Points [20]  Y Axis Data Interval [3]

Frequency [30] GHz   Delay [0.3] Sec   Averaging [1000] Pts   Cal Set [NONE ▽]

Ground Plane [No ▽]  Polarization [CoPol Only ▽]  FF Resolution [High ▽]

Scan Comments:

[CoPol pattern of a standard horn.]

Filepath [C:\Probe Station\Data] 📁

Filename [Scan0810041 ▽]  (SCAN)

—— STATUS ——

Scan Progress  (STOP)

[__________________________]

[EXIT]  [Graphs & Analysis]

ANTENNA NEAR-FIELD PROBE STATION SCANNER

The invention described herein was made by civil servant employees of the United States Government, and a non-civil servant employee working under a NASA contract, and is subject to the provisions of Section 305 of the National Aeronautics and Space Act of 1958, Public Law 85-568 (72 Stat. 435; 42 U.S.C. 2457).

FIELD OF THE INVENTION

The present invention relates generally to a scanner device for the measurement of miniaturized antennas using near-field signals. More particularly, it relates to a probe station scanner for measuring near-field radiated power performance of a miniaturized antenna, and for transforming the measurements into far-field characteristics.

RELATED ART

Before an antenna can be used for a particular application, the antenna must first be tested to determine its performance characteristics. One characteristic, the radiation pattern, is generally tested in an antenna range. Antenna range types are numerous, and the choice of range to use is dependent on many factors. Antenna size, frequency of operation, mechanical supporting requirements and the intended application are but a few of the factors. For example, an electrically large antenna that must be tested indoors, requires the use of a near-field scanning range. Alternatively, a similar, but electrically smaller antenna may he able to utilize a far-field range. Smaller yet, miniaturized antennas impose additional requirements not addressed by the conventional ranges and hence require a new approach.

Space exploration systems require the use of miniaturized antennas for surface networks and planetary exploration communication. In addition, miniaturized antenna systems find use in cellular telephones, various wireless connections, and a variety of embedded medical circuits for diagnostics and treatment. Generally, a large number of these antennas are produced on a single wafer much like semiconductor devices. Probe stations, used for semiconductor device characterization, can also be used to obtain antenna patterns when the devices are antennas. Doing so allows the antennas to be tested on wafer enabling a number of advantages over a more conventional technique. Conventionally the antennas must be separated using a procedure that is very time consuming and expensive. Then the single antenna must be placed in a fixture for testing. The antenna must he isolated from the fixture, or the fixture will adversely effect the characterization. Accordingly, the conventionally tested results do not always produce the true radiation pattern of the antenna.

BRIEF DESCRIPTION OF THE INVENTION

To facilitate the understanding of the present invention, these abbreviations will have the following definitions, unless otherwise provided within this document.
AUT antenna under test
CPU central processing unit
CW continuous wave
DC direct current
FFT fast Fourier transform
Gain amplification factor; a boost in signal strength
G-S-G ground-signal-ground
GUI graphical user interface
MEMS micro electro-mechanical system
RF radio frequency
VNA vector network analyzer This invention provides the capability for characterizing miniaturized antennas while biasing any necessary active (e.g., MEMS) devices. This is conducted by measuring the near-field patterns of small micro-channel patch antennas. Each antenna is excited using a probe station system while a waveguide scans the space above the antenna to measure the near-field signal. Upon completion of the scan, the near-field patterns are transformed into far-field patterns. Along with taking data, this system also allows for extensive graphing and analysis of both the near-field and far- field data. The procedures for setting up a test, conducting a test, and analyzing the resulting data are also described.

The invention comprises a near-field probe station and its use for scanning the near-field radiated pattern of a miniaturized printed circuit antenna. The probe station comprises a three axis probe slide and rotation platform. A coplanar waveguide and RF probe are mounted to move along the three axes to provide input signals to the antenna under test. The station may also include a DC probe to apply a DC bias to the antenna being tested. A network analyzer such as an HP8510C and a computer are also included. A software program is usable with the computer for the analysis of near-field data collected with the scanner. This program is capable of displaying three dimensional contours of the far-field pattern distribution of the antenna.

The invention also includes a software system for capturing the near-field signals from a miniature antenna and for characterizing the actual behavior of the antenna based upon the captured signal. This system comprises a management software package having the keyed-in capability of calling up other software packages embedded therein. It also includes two embedded software packages. The first package is useful in making a near-field to far-field transform. The second package is a visual package having the capability of showing three dimensional, contours, vertical cuts and horizontal cuts through the far-field pattern distribution of the antenna.

BRIEF DESCRIPTION OF THE DRAWINGS

The drawings as described herein are presented for the purpose of illustrating the invention, and its environment, and are not intended to serve as a limitation on the invention.

DETAILED DESCRIPTION OF THE INVENTION

The present invention relates to antenna metrology hardware for non-destructive characterization of miniaturized passive or active antennas fabricated on substrates (e.g., Gallium Arsenide (GaAs), Silicon (Si), Lanthanum Aluminate (LaAlO$_3$, etc.) which are difficult to measure in traditional ranges because of their smaller size, fragility, and non-trivial DC biasing or complicated fixturing requirements. For the purposes of the present invention, miniaturized antennas are those having a dimension of about 1 cm or less, down to 1 mm or even smaller. Stated differently, these small antennas have a cross sectional size of about ⅕ to about ½ lambda, whereas large antennas have a size greater than ½ lambda. The scanner consists of a precision mechanical slide system, software analysis features, a probe station, and an automatic network analyzer. The turn-key antenna near-field data acquisition system in this scanner is extremely fast, automated, and user friendly. It only requires user information to be entered via soft-keys into the input control panel.

Other functionalities of the invention include report-quality image storage for publication purposes, accessible data files for further future processing; and text documentation associated with each data folder describing the test parameters and test conditions. Compared to other conventional ranges, this scanner offers considerable cost savings, reduces prototype characterization time from months to days, does not require a separate stand-alone data analysis and graphic visualization platform, and is particularly suitable for characterization of miniature antennas.

Figure 1:
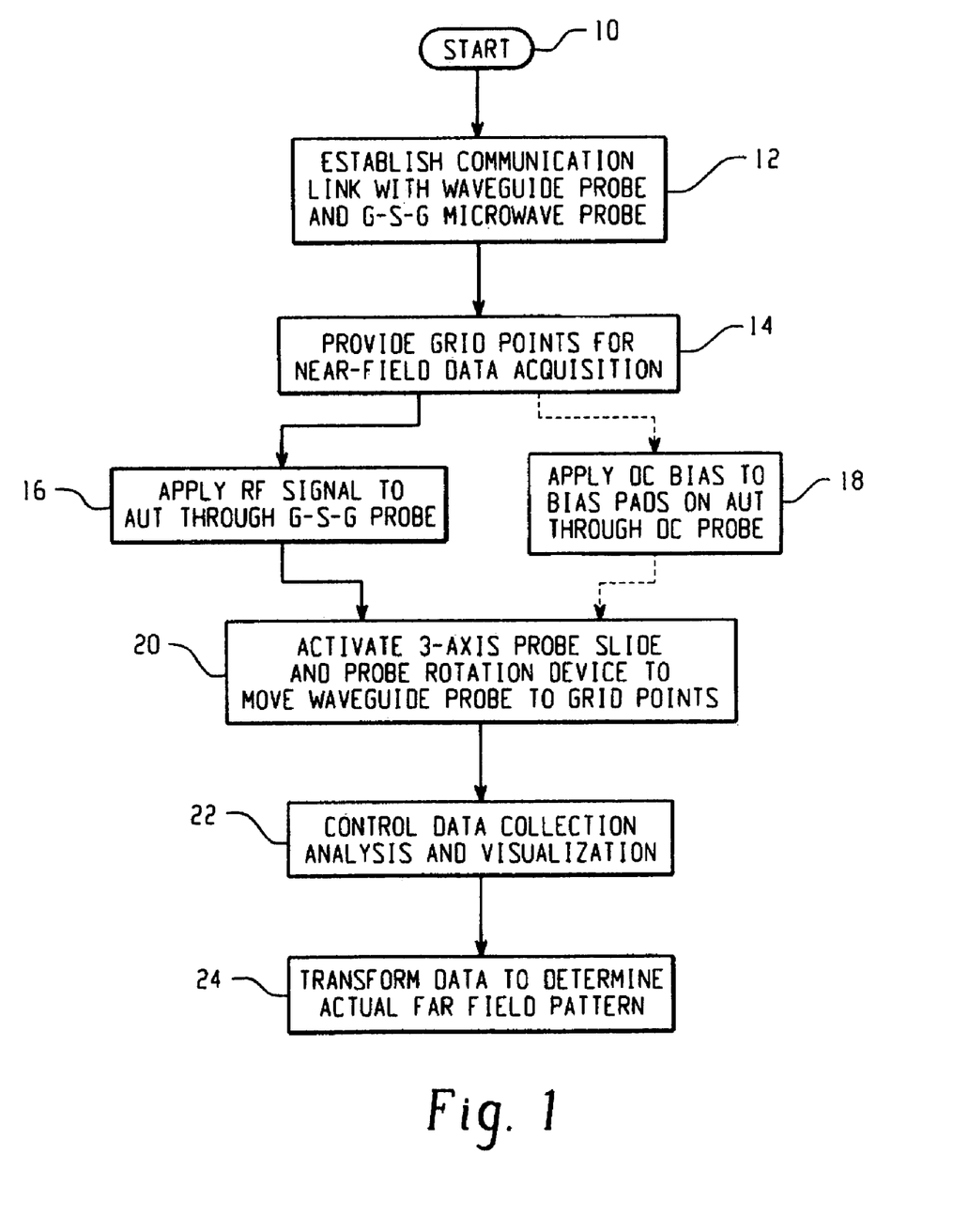
FIG. 1 is a flowchart of a computer program for characterizing miniature antennas.

A simplified flowchart of the computer program for controlling the various functional features of the invention is shown in FIG. 1. A scan is started at 10 by inputting a command from a computer keyboard. In the first step (12), the computer establishes a communication link with a scanning probe (described in the flow sheet as a waveguide probe) and with the ground surface ground (G-S-G) microwave probe at the probe station. In the second step (14), a rectangular matrix of grid points for the near-field data acquisition is provided to the probe station. In step 3 (16), an RF signal is applied to the AUT through the G-S-G probe. Also, to the extent required, a DC bias is applied at 18 to any bias pads on the AUT through the DC probe. Step 4 activates the 3-axis probe slide and probe rotation device at 20 to move the device to the various grid points established in Step 2 to record data at each point. In step 5 (22), the computer controls the collection, analysis and visualization of the data collected in Step 4. In step 6 the data is converted or transformed (24) by the use of a FFT into the actual far-field pattern.

The invention features software which accesses commercially available software codes such as LabVIEW, Visual Basic, and Matlab to analyze the measured near-field data to be able to display far-field antenna patterns either in 3-dimensional, contour form, or as vertical or horizontal cuts through the antenna's far-field pattern distribution. LabVIEW is a graphical programming software tool available from National Instruments. Visual Basics is a tool to aid in the development of a wide range of applications based upon the NET framework, and is available from Microsoft. MATLAB is a matrix algebra software package that utilizes various algorithms for numerical experiments, graphics and calculations. It is available through The Mathworks, Inc.

Space exploration systems require miniaturized antennas for surface networks and planetary exploration communication. Thus, for design and optimization of prototype antenna candidates for these uses, an effective, fast, and reliable characterization capability is required. The near-field probe station scanner of the present invention provides non-destructive characterization of small passive and active antennas, fabricated on semiconductor and/or dielectric wafers (e.g., GaAs, Si, LaAlO$_3$, etc.).

The near-field probe station scanner includes a near-field data acquisition feature that allows for maximum power capturing and therefore is very suitable for characterizing miniature antennas with low gain. This capability allows the characterization of prototype antennas, either of a single design, multiple variants of one design, or multiple antenna designs on the same substrate in one session. This is achieved without the requirement for dicing or packaging of the substrate, and no test fixtures are necessary. Maximum near-field energy can be captured from a single or a multiple number of small antennas while they are DC biased without requiring a special fixture. RF signal and DC bias to the AUT are applied through the probe station RF and DC probes. Multiple measurements and characterizations can be accomplished in hours or days instead of months as with conventional ranges. Thus, this measurement capability significantly reduces time and costs associated with antenna characterization, and allows for quick optimization of prototype design concepts through measurement validation.

Figure 2:
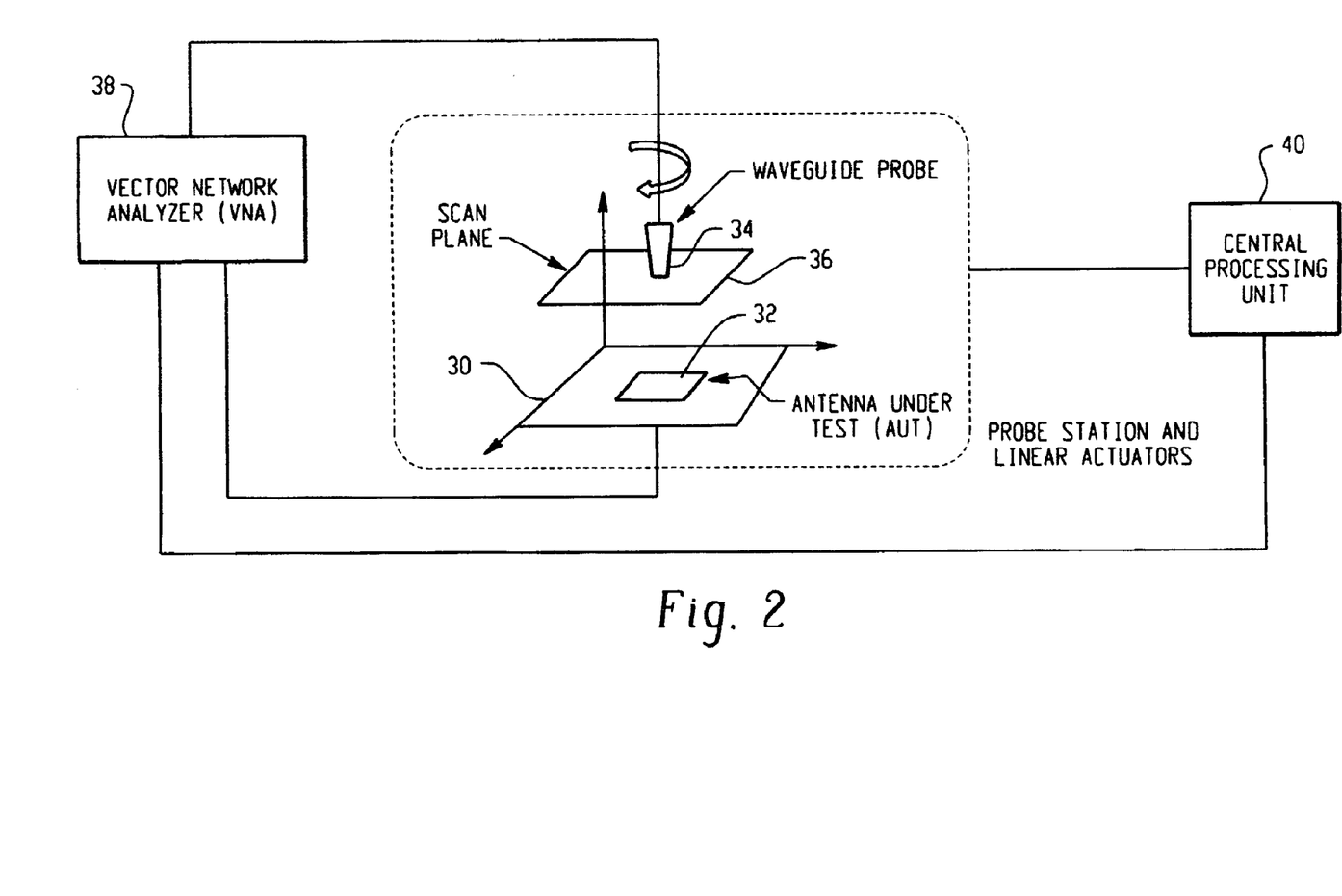
FIG. 2 is a schematic of the antenna scanner.

The schematic of FIG. 2 shows a platen 30 on which an AUT 32 is mounted. A waveguide probe 34 is positioned above the AUT and is for movement within the scan plane 36 in accordance with instructions that are received from the VNA 38. The VNA receives data from the AUT 32 and communicates with the CPU 40.

Figure 3:
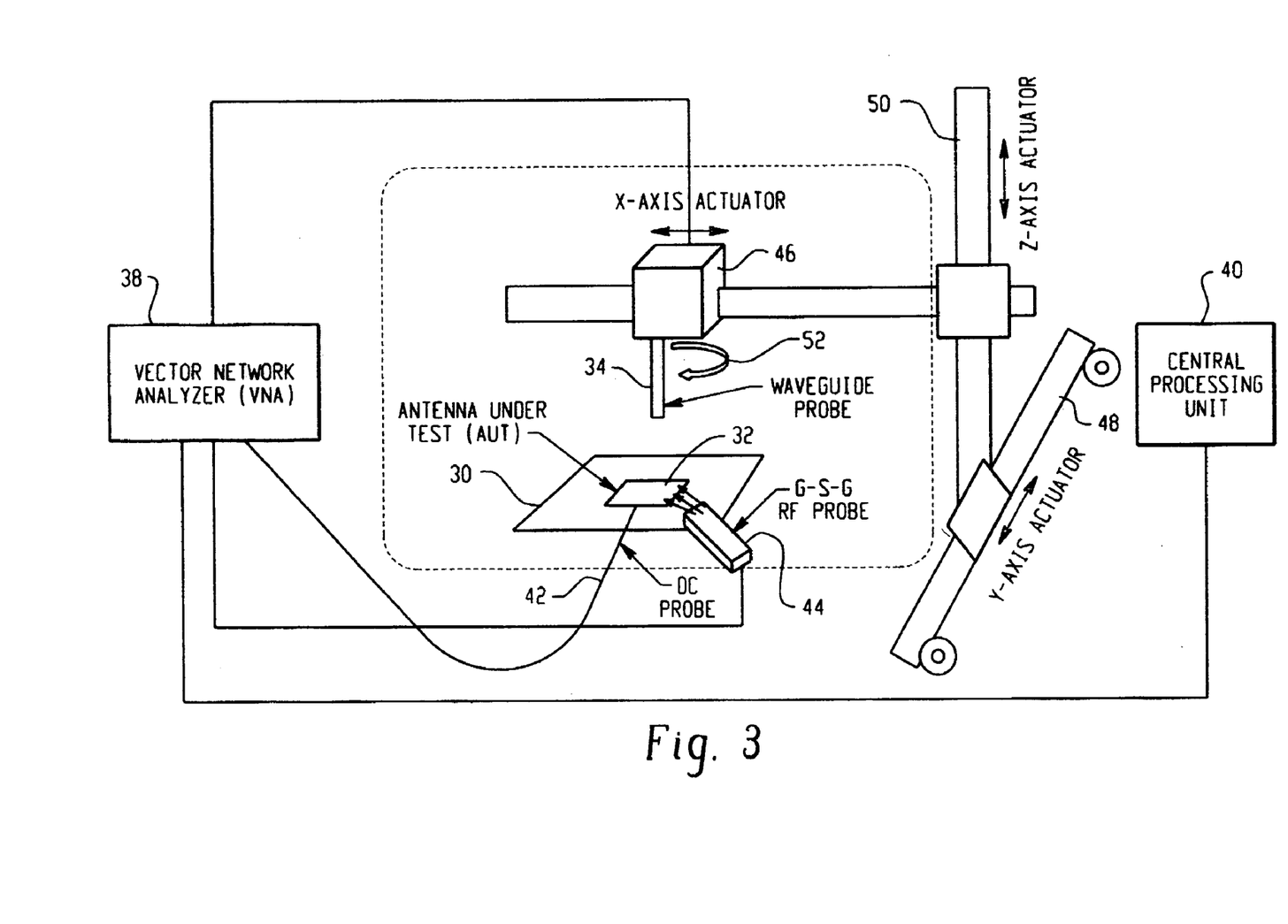
FIG. 3 is a layout showing the hardware components of the present invention.

Turning next to FIG. 3, additional details of the hardware of the present invention are shown. In particular, a DC probe 42 is connected to the VNA 38 and provides a DC bias to any bias pads on a transmitting AUT. The implementation of the present invention requires a RF probe station, a coplanar waveguide ground-signal-ground (G-S-G) microwave probe 44, and a scanning probe 34 such as an open ended waveguide probe. The RF probe station is available from sources such as Cascade Microtech, Inc, Signatone Corporation and J micro Technology, Inc. G-S-G probes are made by GGB Industries, Inc., The Micromanipulator Company, and Lake Shore Cryotronics, Inc. Scanning probes such as waveguide probes are available from sources such as Nearfield Systems, Inc, Agilent Technologies, Inc and Maury Microwave Corporation. A computer controlled 3-axis probe slide and probe rotation mechanism provides 4 degrees of freedom for data acquisition at described grid points of a near-field plane very close to the AUT and at different polarizations. This mechanism comprises an X-axis actuator 46, a Y-axis actuator 48, a Z-axis actuator 50, and a rotator 52. A vector network analyzer/microwave receiver 38 (such as a HP 8510C) and a computer 40 complete the system. Software controlled data analysis and visualization after each scan is achieved through a GUI which displays the to AUT's far-field radiated pattern. Compared to prior art scanners, this near-field scanner offers much faster antenna measurements at a fraction of the cost.

Figure 4:
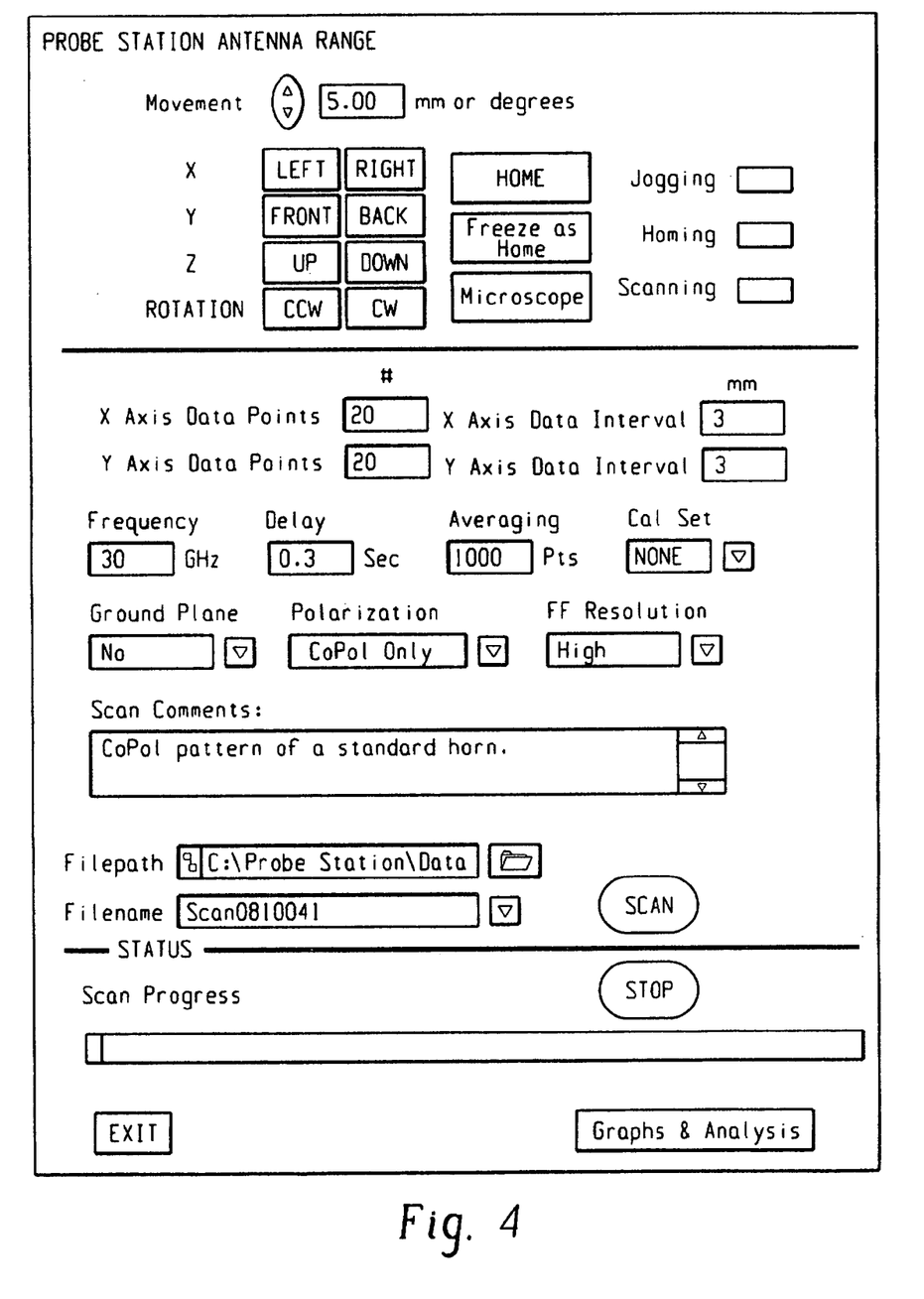
FIG. 4 shows a panel for control of the operation of the scanner.

The LabVIEW control panel is shown in FIG. 4 and consists of a window to jog the probe, enter appropriate scan parameters, and see initial test data which can be viewed and analyzed later through the methods to be explained infra. The top section is used for jogging the is probe. The user can enter the desired linear movement of the RF probe in millimeters, or the rotation in degrees followed by clicking one of the eight movement buttons corresponding to the four different axes to execute the movement. When the probe is jogged to a new position, this position automatically becomes the new Home position for the scanner. When running a scan, the Home position preferably is directly above the center of the intended scan area.

In certain circumstances the user may need to move the probe, but may want to retain the current Home position. This can be accomplished with the Freeze as Home button. When this button is selected no jogging command can reset the Home position. When this button is deselected the original Home position will still be preserved until a jog is performed again. The probe can be returned to the starting position at any time outside of performing a scan by selecting the Home button.

The top section of the panel also includes a Microscope button which is used to load an antenna onto the probe station's platen. The waveguide probe must be moved out of the way to enable the microscope to be loaded onto the bridge mount: to aid in biasing the antenna. When this button is pressed, the probe will be positioned to the far right corner of the linear actuation range. This movement will not cause the Home position to be reset. Pressing the Home button will reposition the probe to the position it was in before the Microscope button was selected. If the probe had not been positioned prior to pressing the Microscope button, then the Home position will not be defined by the user but by a pre-defined location hard coded into LabVIEW.

The section of the control panel below the jog portion of the panel is the parameter portion. This section is located on the center of the LabVIEW panel. Here, the user must input all the important parameters for the scan. The user should use caution when establishing the number of data points and spacing to prevent crashing the probe with any objects that may be in the scan area. Every input must have an entry except for the Scan Comments text box. This is an optional input that will allow the user to record any important scan information to the Experiment_Parameters.rtf file.

At the bottom of the control panel is the status portion of the panel. Here, the user can monitor the progress of the scan, stop the scan, or analyze the data after a scan is complete. When the Stop button is selected the scan will be abruptly stopped at the beginning of the next horizontal data point. If the program requires scanning the area twice at 90-degree rotation shifts, then data will be saved for the first shift if the Stop button is selected after the first scan shift. Otherwise, no data will be saved for that scan. The Graph & Analysis button will load a new window to allow the user to view and analyze data from current or previous scans, to be explained hereinafter.

For measurements, the AUT is first placed on the probe station platform. An RF signal is then applied to the AUT feed point through G-S-G probe, and DC bias to any bias pads on the AUT is applied through a DC probe. The near-field scan area dimension and the grid size resolution for probe data intake are user defined in the control panel input. Probe slide hardware determines the scan area and number of measurement points from the user input. Once the probe is directed to move to the "home" position of the scan box, the scan process is started with a button click. The RF probe auto traverses on the scan area and captures the near-field power distribution from AUT at the grid points. Automated data storage and multiple window graphic display allows pattern visualization capabilities in cross-sectional, 3-dimensional, and contour formats for easy figure-of-merit comparison among design variations and to quickly arrive at an optimized design.

Figure 9:
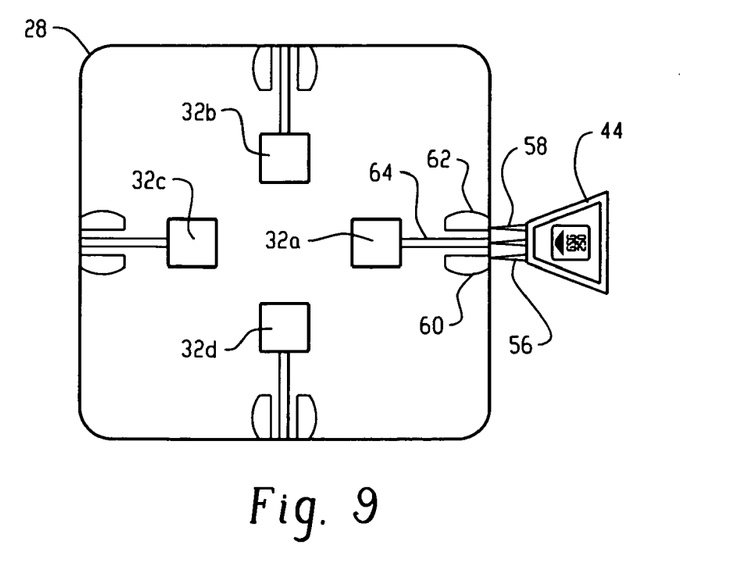
FIG. 9 is a top view showing multiple antennas on a single wafer.

Near-field data acquisition allows better power capturing capabilities and therefore is very convenient to characterize miniaturized antennas with low gain. This new capability allows prototype antennas to he characterized, either of a single design, multiple variants of one design, or multiple antenna designs on the same substrate, in one session. FIG. 9 shows multiple antennas 32 a, b, c and d on a singular wafer 28, and mounted on a platen 30. Four G-S-G probes 44 are also shown, each with a signal probe 64 contacting the AUT. The two grounds 56, 58 of each probe are joined to pads 60, 62 on the platform 28 on which the antennas are mounted.

Significant advantages of the present invention include 1) fast, turn-key, automated, user-friendly system, 2) elimination of wafer dicing or packaging of individual antenna before characterization, 3) elimination of any test fixture or mounting scheme with special connector, launcher, or feed line transition, thereby reducing prototype optimization time and cost, 4) data analysis and graphic visualization without requiring costly, stand-alone platforms, and 5) extensive pattern visualization capability. The scanner system can be used for such programs as exploration missions in which it can accelerate the development and characterization of miniaturized antennas for lunar/planetary surface to surface communications.

Several other advantages of the invention are a) the scanner offers many versatile viewing and data comparison options; b) the in plug-and-play mode features are unique with respect to other known antenna test ranges; c) because miniaturized antennas are required for many applications (e.g. surface networks and planetary exploration communication), an effective, fast, and reliable characterization capability can be very timely in maintaining project timelines. Further, the technology can be used for applications such as evaluation of miniaturized antennas for cellular telephones, and embedded medical circuits.

The present invention can be implemented in accordance with the following summary of the procedure for preparing and calibrating the test equipment, conducting the test, and then converting the near-field results into more useful far-field data.

An S-parameter (e.g, $S_{11}$) calibration is performed with the VNA at the anticipated scanning frequency for the purpose of defining the scattering parameters of the system. The frequency range is limited by the VNA and the availability of the scanning probe. The VNA is operational from 45 MHz to 40 GHz, and the probes size will vary according the the desired frequency, with the probe size decreasing inversely to frequency. Therefore, in principle the systems can be operational within the aforementioned range. This calibration will help ensure the antenna is properly mounted and ready for scanning before the test begins. In this example, the scanner is run using the LabVIEW code.

The waveguide probe is moved into a corner of the linear actuator so it does not interfere with a visual magnifier such as a microscope that may be used for connecting the RF and DC probes to the antenna. The AUT is placed onto the Probe Station's platen and is maintained in position using suitable means such as a vacuum system or other means that does not distort the AUT or alter its power distribution properties. The RF probe is then placed on the antenna's feed port followed by any DC probes that may be needed. The $S_{11}$ measurements are checked on the VNA to verify that the antenna is properly biased.

After the antenna is successfully biased, the microscope is removed and the microscope mounting bracket is returned to the far back of the probe station to avoid contact with the probe during operation. Removing the microscope and repositioning the bridge mount may cause movement and vibrations in the probe station. Accordingly, the $S_{11}$ parameters are rechecked to assure the antenna is still properly biased.

To prepare the scan, the waveguide probe is positioned directly over the center of the AUT. There are two different options for doing this. The user can either manually jog the probe from the position at the corner of the linear actuator, or use a Home button on the computer keyboard. If the probe has been moved prior to centering, then it will return to this original position. If the probe had not been moved prior to centering, then the Home button will place the probe at a predefined location hard coded into the computer program. Caution should be exercised when moving the waveguide probe to prevent crashing it into the probe Station. The probe is then centered over the AUT, at the desired height and rotation for conducting the desired tests before proceeding.

After the probe is prepared, the following test parameters are keyed into the computer. These parameters include:

Frequency—The single frequency at which the AUT will radiate (e.g., 2 GHz) The equipment involved in the scan (waveguide, VNA, etc.) must be compatible with the set frequency used in the scan.

Delay—The time delay the probe should pause at each data position. The data are recorded 100 ms before the probe begins to move again. So for a delay of 1s, the data are measured and recorded 900 ms after stopping. If Delay is set to zero, a continuous scan is conducted.

Averaging—The number of data points averaged by the VNA for each recorded data point.

Ground Plane—Used in far-field calculations. Yes is chosen if the AUT has a ground plane. Otherwise, N is selected.

Cal Set—Allows the user to load a predefined Cal Set saved on the VNA. This Cal Set must be a CW calibration conducted directly on the VNA and must coincide with the correct frequency entered in the LabVIEW Panel. If the Cal Set differs from the frequency being tested or is not CW, it will be ignored by the scanner.

Polarization—Allows polarization of the AUT to be chosen. This determines the type of data that will be saved and how calculations are done for the far field conversion.

FF Resolution—Used to determine the number of data points to be used in the far-field conversion. Standard creates a far-field matrix of 128×128, High creates a matrix of 256× 256, and Very High creates a matrix of 512×512.

X axis Data Points—The number of data points along the x-direction that should be recorded during scanning. This number is typically an integer value.

Y axis Data Points—The number of data points along the y-direction that should be recorded during scanning. This number should be an integer value.

X axis Data Intervals—The interval spacing between x data points in units of millimeters. This number can be a decimal value to the hundredths position.

Y axis Data Intervals—The interval spacing between y data points in units of millimeters. This number can be a decimal value to the hundredths position.

Scan Comments—This text box allows the entry of any comments about the scan to be saved in the parameter text file.

Filepath—The file path of the data being saved. This data path must specify a folder in memory.

Filename—The File name of the data being saved. This Filename creates a folder that contains all the tiles created from the scan. The folder will have the unique name for the scan, however, the files inside the folder will be uniform across other scans.

When the test apparatus is properly set up, the scan begins by pressing the Scan button. The probe positions itself over the Home position. It then proceeds to position itself at the location of the first data point. All scan lines are conducted across the x-axis. The status bar gives an estimate of the progress for the scan.

Figure 5:
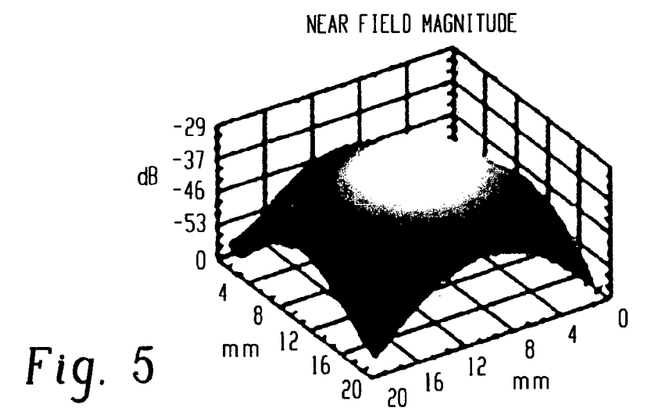
FIG. 5 is a three-dimensional graph of a near-field magnitude plot.
Figure 6:
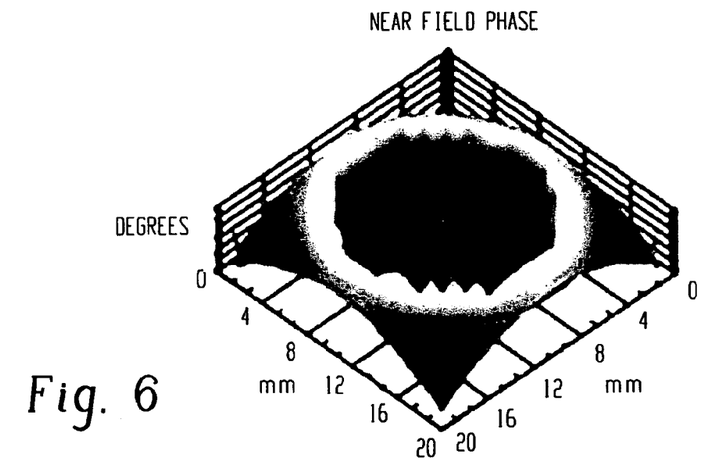
FIG. 6 is a near-field phase plot.
Figure 7:
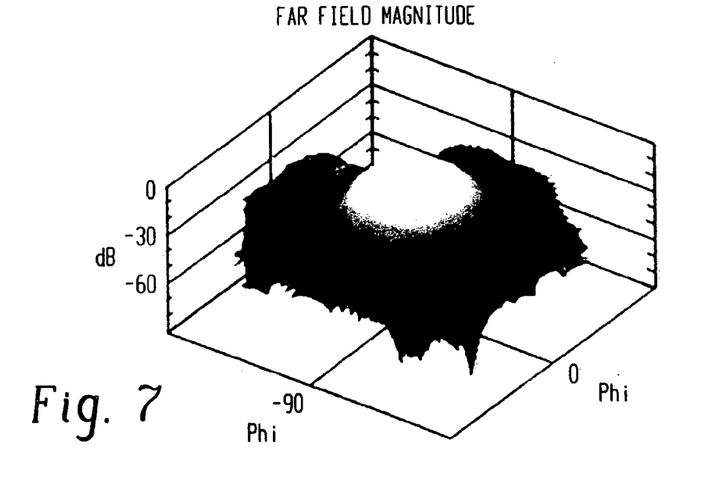
FIG. 7 is a far-field transform of the data shown in FIGS. 4 and 5.

When the scan is complete, the data is displayed in three graphs shown as FIGS. 5, 6 and 7. The Figures are shown in color to more accurately display the various slopes and contours portrayed in the graphs. The graphs are generally located on the right side of the LabVIEW panel. The Near-Field phase and magnitude are typically displayed in the two small graphs. FIG. 5 and FIG. 6 respectively, shown on the monitor, while the Far-Field pattern is displayed in the larger graph (FIG. 7). Depending on the polarization type, the scan may need to be conducted twice at 90 degree rotation shifts. If two scans are required, the graphs will be updated twice. After the first scan the near field magnitude and phase are displayed in the two smaller graphs. If the scan is "CoPol and CrossPol" then the Co-Pol far-field is also be displayed for the first scan. If the scan is circular no far-field pattern will be displayed. After the second scan, the new near-field magnitude and phase are then displayed along with either the circular far-field or updated Co-Pol far field dependent on the type of polarization that is chosen. For more graphing features, a "Graph & Analysis" button located in the status portion at the bottom of the LabVIEW panel can be used.

The "Graph & Analysis" button opens a screen allowing the user to choose the desired data folder. When a data folder is chosen, a display shows a list of different graphs available based upon the polarization of the scan within the data folder. The user may choose as many of the graphs to display before clicking the Open button. Each graph opens in its own separate window. This allows as many graphs to be viewed as required. The graphs can he resized by maximizing or dragging the window edges. The 2D graphs representing the H-cut and V-cut allow the user zoom in on a region of the graph. Double clicking on the graph will return the graph to its original state. Future graphs can be opened from the File menu on each graph window. Each graph has the ability to be saved as a bitmap file in the folder containing the scan data for later use. This is accomplished by clicking on Save as Image in the File menu. Each graph can also be printed from the File menu. The printed size is determined by the size the graph appears on the monitor. A full page printout can be obtained by maximizing the graph window and choosing Print.

The Data Files

After each scan, a number of data tiles are saved to the scan folder. These tiles are matrices delimited by a tab and can easily be accessed using a computer program such as Excel. The scan polarization determines the number and type of files saved in each scan folder. Each scan will contain certain files. Those files include:

Graph_Parameters.gd—This is information needed for the graphing feature. If this file is removed or altered the graphing features in LabVIEW may not work.

Experiment Parameters.rtf—This is a text file saved in the "Rich Text File" format. This file will display all the parameters used when the scan was conducted along with any user comments entered in the "comment box" before the scan.

theta.psd—The theta values corresponding to each far field data point.

phi.psd—The phi values corresponding to each far field data point.

u.psd—The u values corresponding to each far field data point.

v.psd—The v values corresponding to each far field data point.

Finally, the LabVIEW program generates the three graphs as shown in FIGS. 5, 6 and 7. The two near field graphs, FIGS. 5 and 6, are constantly updated while data is being taken so the user can monitor the progress and state of the data recorded thus far. For "CoPol & CrossPol" scans, the far field pattern shown in FIG. 7 is updated after each scan shift displaying the Co-Pol far field pattern each time. For circularly polarized scans the far field display will only be updated after the second scan shift.

After a scan is complete, all the appropriate data are saved in the folder named by the user from the LabVIEW Panel. If the folder already exists, the user will be prompted to enter a new folder name before data can be saved. All data files are saved in matrix form with each horizontal data point delimited by a tab. This allows the data to he read easily into a spreadsheet.

Obviously, the relative sizes and locations of these panels in the window is arbitrary and can be changed in accordance with the needs and the preferences of the user.

A more detailed analysis can be made of the graphs shown in FIGS. 5, 6, 7 and 8 from the Graph & Analysis button located at the bottom of the LabVIEW Panel shown in FIG. 4. This option displays a menu for the user to choose which folder contains the data. When a properly formatted folder is chosen, the menu reads the polarity of the data from the contents of the folder and displays a list of graphs available for viewing. The number of different data files for plotting range from three to six, depending on the scan polarity. For example, a "CoPol Only" scan will contain the near field magnitude, near field phase, and far field data matrices for plotting. However a "CoPol & CrossPol" will contain both magnitude and phase for each near-field scan and a Co-Pol far-field pattern along with a Cross-Pol far-field pattern. The software determines the polarity that the data folder contains and only allows the user to choose graphs appropriate for that scan.

When a data folder is chosen, a variety of graphs can be selected for viewing. Each data file can be viewed in four different formats. These formats are 3D, H-Cut, V-Cut, and Contour. The 3D graph option shows the data in 3 dimensional space allowing the graph to be rotated for viewing it at different angles. The H-Cut will show the horizontal cut of the data with respect to the probe station beginning from left to right, whereas, the V-Cut will show the vertical cut of the data with respect to the probe station from top to bottom. Finally, the contour will display the magnitude of the data as if it were viewed directly from above the probe station. It is displayed through shadowing where lighter shades represent a higher value and darker shades represent lower values.

Each of the 3D graphs viewed in FIGS. 5, 6 & 7 is given a folder name and graph type displayed in the caption of the window as well as being displayed above the graph. Each graph also contains a series of menus depending on the type of graph being displayed.

Every graph contains a File menu. Inside the File'menu are four options. These options are Open, Save as Image, Print, and Close.

The Open option will redisplay the graph menu and allows the user to open any new graphs they choose.

The Save as Image option will save the current screen shot of the graph to a bitmap image in the corresponding data folder for that graph.

The Print option writes the graph to a printer.

Finally, the Close option exits out of that single graph window. Each graph contains a Graph menu. Depending on the data being displayed and graph type, the Graph menu includes different options. Each Graph menu, however, will at least contain the Add Cursor option. When selected, a cursor will be added to the graph at the Maximum value which can be dragged around to different data points on the graph. The graph title will also change to include the coordinates of the cursor.

For data other than near field phase, the user has the option to find the peak of the graph. This can be done by selecting Find Peak in the Graphs menu. When this is chosen the cursor is moved to the graph's peak and the position is reflected in the graph's title.

Figure 8:
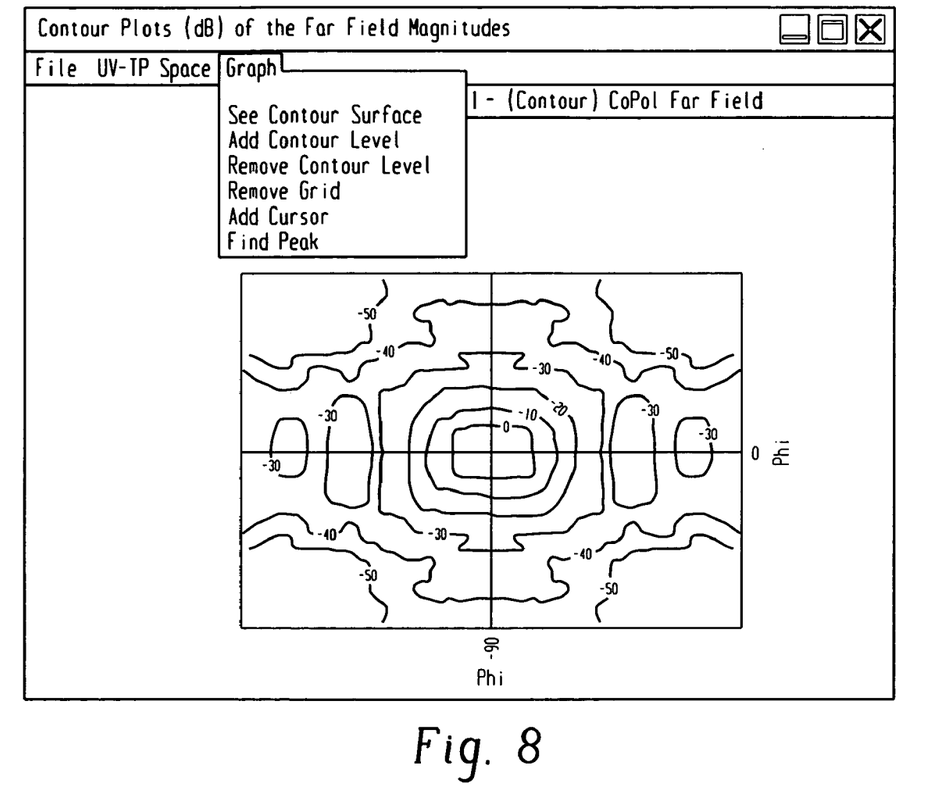
FIG. 8 shows contour plots of the Far Field Magnitude.

Contour graphs of the type shown in FIG. 8 contain additional features from the other three graph types. The contour graph can display both the surface in shades representing different point values and also in the form of contour lines. In the Graph menu the user can choose See Contour Levels and the graph will be transformed from surface shading to contour lines. When the graph is in the contour line display, the menu option will change to See Contour Surface and can be transformed back to the surface plot through this new option. The data represented by the graph will dictate the spacing of these contour lines. If these contour lines are too crowded or not sufficient, the user can add and remove contour lines as needed. When the graph is in Contour-Level mode, two new options are displayed in the Graphs menu. These are Add Contour Level and Remove Contour Level.

For far-field patterns, the −3 dB contour line is displayed in red. From the Add Contour Level menu option, contour lines of any value (to the tenths decimal position) can be added to the graph in any color chosen by the user.

The user can enter the contour level to add to the graph along with adjusting the color of the contour level by sliding the scroll bars on the right corresponding to the colors red, green, and blue. The color box indicates the current color chosen by the user. The screen defaults at black which is when all three scroll bars are positioned to the far left. By scrolling the color bars to the right, the color of the contour level will contain more of that corresponding color. For example, for a green contour level, the red and blue scroll bars should remain to the far left while the green scroll bar is slid to the far right. Along with adding new contour levels a user can remove any existing contour levels Each existing contour level is listed in a drop-down menu. The user should select the contour level to be removed and click OK. Only one contour level can be removed at a time, but there's no limit to how many contour levels must be displayed on a graph.

Another option in the Graph menu is the Remove Grid option When grid lines are removed for better visibility, this option will be changed to Restore Grid, so the user has the option to restore the grid lines back onto the graph.

The cursor option can be used in both the surface and contour parts of the contour display. When switching between surface and contour lines, the cursor will be removed and the user can add the cursor again to continue using it. The cursor will not necessarily be added in the same spot it was before the graph transitioned from surface to contour lines or vice versa.

Far-Field Graphs

Far-field graphs differ from the near-field graphs in several ways. First, all the near-field graphs contain the same size data matrix. However, far-field data matrix sizes are defined by the FF Resolution and the MATLAB transformation of the near-field data to far-field data. The FF Resolution input on the LabVIEW panel allows the user to decide on the size of the matrices to use in the far-field transformation. The near-field data will consist of part of this matrix padded with 0s everywhere else. When the transformation occurs, the entire matrix is analyzed and unrealistic data is removed. In this case, unrealistic data would be data points where theta exceeds 90 degrees. These two factors determine the size of the far-field data matrix. Another difference between far-field plots and near field plots are the x-, and y-axes. In near-field graphs these axes are defined by the physical space scanned above the antenna. In far-field graphs there are two possible displays. The default display is in theta-phi space. Phi and theta are spherical coordinates attempting to be displayed on a Cartesian graph. This is accomplished by visualizing from above, the hemisphere that makes up the phi-theta plot. Phi remains the same starting at 0 degrees pointing directly right from the center of the plot and theta is displayed as the radius from the center. of the graph. This can be visualized by imagining a hemisphere laying flat on a plane. The phi-theta combinations that lie along the hemisphere will be pulled directly down onto the plane below the hemisphere. The z-axis represents the normalized power in dB at each phi-theta point on the plane. This representation causes the graph to take on a circular form limited by the fact that theta (the radius) cannot be larger than 90 degrees.

The other coordinate system that far-field graphs can be displayed in is U-V space. All far-field graphs have an extra menu option called Convert to UV Space found in the UV-TP Space menu, unique to far-field graphs. This transforms the graph from theta-phi space to U-V space. While the graph is in U-V space, the menu option becomes Convert to TP Space which allows the graph to be transformed back to theta-phi space. U-V space is an imaginary space used in the calculation of near-field data to far-field data and is familiar to those in the antenna pattern discipline. All the other graph features can be run in U-V space in the same manner as in the theta-phi space.

Raw Data vs. Graphed Data

The coordinate system for transforming near-field data to far-field data uses the upper-left point as the origin with the x-axis pointing down and the y-axis pointing across. Therefore, a far-field transformation of these data will display the data as if viewed at a 90 degree clockwise shift from the direction the data are scanned. However, to keep the data display as simple as possible, this software rotates the data back to the same orientation being scanned on the probe station. This is important if raw far-field data are to be used later.

Each scan folder contains these files:

Graph_Parameters.gd—This is information needed for the graphing feature. If this file is removed or altered, the graphing features in LabVIEW may not work.

Experiment Parameters.rtf—This is a text files saved in the "Rich Text File" format. This file displays all the parameters used when the scan was conducted, along with any user comments entered in the "comment box" before the scan.

theta.psd—The theta values corresponding to each far-field data point.

phi.psd—The phi values corresponding to each far-field data point.

u.psd—The u values corresponding to each far-field data point.

v.psd—The v values corresponding to each far-field data point.

The different polarization files are described below:

CoPol Only—CoPol_Magnitude.psd—The Near-Field Magnitude of the Co-Pol Scan. CoPol_Phase.psd—The Near-Field Phase of the Co-Pol Scan. CoPol.psd—The Co-Pol Far-Field Pattern. CoPol_Real_Data.psd—The real data of the Co-Pol Scan. CoPol_Imaginary_Data.psd—The imaginary data of the Co-Pol Scan.

CrossPol Only—CrossPol_Magnitude.psd—The Near-Field Magnitude of the Cross-Pol Scan. CrossPol_Phase.psd—The Near-Field Phase of the Cross-Pol Scan. CrossPol.psd—The Cross-Pol Far Field Pattern. CrossPol_Real_Data.psd—The real data of the Cross-Pol Scan. CrossPol_imaginary_Data.psd—The imaginary data of the Cross-Pol Scan.

CoPol & CrossPol—CoPol_Magnitude.psd—The Near-Field Magnitude of the Co-Pol Scan. CoPol_Phase.psd—The Near-Field Phase of the Co-Pol Scan. CoPol.psd—The Co-Pol Far-Field Pattern. CoPol_Real_Data.psd—The real data of the Co-Pol Scan. CoPol_imaginary_Data.psd—The imaginary data of the Co-Pol Scan. CrossPol_Magnitude.psd—The Near-Field Magnitude of the Cross-Pol Scan. CrossPol_Phase.psd—The Near-Field Phase of the Cross-Pol Scan. Cross-Pol.psd—The Cross-Pol Far Field Pattern. CrossPol_Real_Data.psd—The real data of the Cross-Pol Scan. CrossPol_Imaginary_Data.psd—The imaginary data of the Cross-Pot Scan.

LH Circular—x_Magnitude.psd—The Near-Field Magnitude of the x scan. x_Phase.psd—The Near-Field Phase of the x scan. x_Real_Data.psd—The real data of the x Scan. x_Imaginary_Data.psd—The imaginary data of the x Scan. y_Magnitude.psd—The Near-Field Magnitude of the y scan. y_Phase.psd—The Near-Field Phase of the y scan. y_Real_Data.psd—The real data of the y Scan. y_Imaginary_Data.psd—The imaginary data of the y Scan. LH_Circular.psd—The LH Circular Far-Field pattern.

RH Circular—x_Magnitude.psd—The Near-Field Magnitude of the x scan. x_Phase.psd—The Near-Field Phase of the x scan. x_Real_Data.psd—The real data of the x Scan. x_Imaginary_Data.psd—The imaginary data of the x Scan. y_Magnitude.psd—The Near-Field Magnitude of the y scan. y_Phase.psd—The Near-Field Phase of the y scan. y_Real_Data.psd—The real data of the y Scan. y_Imaginary_Data.psd—The imaginary data of the y Scan. RH_Circular.psd—The RH Circular Far-Field pattern.

The near-field to far-field transformation is implemented by the probe station near-field scanner.

Assuming that the probe is a perfect linear antenna, the total aperture field measured by the probe can be represented in the coordinate system shown above as follows:

$$\overline{E}_a(x,y) = E_{ax}(x,y)\hat{i}_x + E_{ay}(x,y)\hat{i}_y \qquad (1)$$

where, $E_{ax}(x,y)$ is the complex field measured with the probe oriented in the $\hat{i}_x$ direction and $E_{ay}(x,y)$ the field measured with the probe $\hat{i}_y$ directed. This expression is valid for any antenna, regardless of orientation or polarization, inasmuch as the total vector field is simply resolved into two orthogonal components. Obviously if a single scan is used to obtain aperture field data, the field of the orthogonal polarization is assumed to be zero.

Using the magnetic field equivalence principle, the far zone radiation field of this aperture field can be expressed as:

$$\overline{E}(\theta, \phi) = E_\theta(\theta,\phi)\hat{i}_\theta + E_\phi(\theta,\phi)\hat{i}_\phi \qquad (2)$$

with $$E_\theta = \frac{j\beta}{4\pi}[P_x\cos(\phi) + P_y\sin(\phi)] \qquad (3)$$

$$E_\phi = \frac{j\beta}{4\pi}\cos(\theta)[P_y\cos(\phi) + P_x\sin(\phi)]. \qquad (4)$$

The terms, $$P_x(u, v) = \int\int_S E_{ax}(x', y')e^{jux'}e^{jvy'}\,dx'\,dy' \qquad (5)$$

$$P_y(u, v) = \int\int_S E_{ay}(x', y')e^{jux'}e^{jvy'}\,dx'\,dy' \qquad (6)$$

are Fourier Transform integrals in the variables, $$u = \beta\sin(\theta)\cos(\phi) \qquad (7)$$

$$v = \beta\sin(\theta)\sin(\phi) \qquad (8)$$

with $$\beta = \frac{2\pi}{\lambda}.$$

The integration is performed over the surface S, which is defined by the limits of the scan plane. These integrations are the basis of the near-field to far-field transformation. Note, in this application, the integrations of Equations (6) and (7) are performed with the two dimensional Fast Fourier Transform (FFT) routine provided in MATLAB. The FFT requires that the number of sample points be a power of 2. Since, in general, the number of data points from the test will not be a power of 2, the data set is augmented by zeros to meet the FFT criteria. In addition to providing the increased computational speed of the FFT, augmentation increases the resolution of the function in the transform domain. The probe station software utilizes this property by allowing the user to set the resolution of the far-field pattern in the setup screen. Effectively, when a resolution is selected, the total number of points used in the FFT is chosen.

The Fourier Transform relationship is obtained through the variable substitutions defined in Equations (7) and (8). Thus the aperture field is transformed by Equations (5) and (6) to a space defined by the range of (u,v). The transformation can be visualized in this space and this option is provided by the Probe Station Near-Field Scanner Software.

The (u,v) space results from mathematical convenience and has to be converted to (θ,φ) in order to visualize the field in real space. When converting to (θ,φ), points where $$\theta > \frac{\pi}{2}$$

are disregarded. This limitation is imposed by the magnetic equivalence theorem which assumes the aperture field exists in an infinite plane and does not radiate in the region where z<0. The Probe Station Near-Field Scanner Software provides a number of graphing options to visualize the field in (θ,φ) space.

The form of the far-field electric field, shown in Equations (3) and (4), is appropriate for apertures in a conducting ground plane. For apertures in free space, the field is more accurately given by A. Ludwig, "The Definition of Cross Polarization", IEEE AP-S January 1973, pp 116-119.

$$E_\theta = \frac{j\beta}{4\pi}\frac{1+\cos(\theta)}{2}[P_x\cos(\phi) + P_y\sin(\phi)] \qquad (9)$$

$$E_\phi = \frac{j\beta}{4\pi}\frac{1+\cos(\theta)}{2}[P_y\cos(\phi) + P_x\sin(\phi)]. \qquad (10)$$

In general, any component of the far-field can be displayed by using the equation, $$E_{display}(\theta,\phi) = \overline{E}(\theta,\phi) \cdot \hat{i}_d \qquad (11)$$

where $\hat{i}_d$ is a unit vector in the direction of the desired component. In the most general sense, the user can be allowed to choose the component of the field however the software provides the most commonly used components. For example, to display the $\hat{\theta}$ component, $\hat{i}_d = \hat{i}_\theta$ is used in Equation (11).

The co-polarized field and the cross-polarized field are computed following the third definition provided by Ludwig (supra). This definition states that the reference direction of the polarization (Co-Pol) is that direction a far-field probe must match at θ=0 in order to receive maximum power. For the Co-Pol pattern, this probe must match and maintain the relationship with $\hat{\theta}$ and $\hat{\phi}$ at all angles. Similarly, Cross-Pol pattern is: obtained by using a unit vector orthogonal to the Co-Pol vector.

For a linearly polarized AUT, the co-pol direction depends on the orientation of the AUT. So for an AUT with a polarization angle that is oriented at an angle β to the $\hat{x}$ axis, $$\hat{i}_d = \hat{i}_{co} = \cos(\phi-\beta)\hat{i}_\theta - \sin(\phi-\beta)\hat{i}_\phi \qquad (12)$$

and $$\hat{i}_d = \hat{i}_{cross} = \sin(\phi-\beta)\hat{i}_\theta - \cos(\phi-\beta)\hat{i}_\phi. \qquad (13)$$

Because the probe that is used with the Probe Station Scanner is a linearly polarized waveguide, a circularly polarized AUT requires two scans. The second scan must be done with the probe rotated 90° from the first. The right hand and left hand polarized components of the field are constructed from using the unit vectors $$\hat{i}_d = \hat{i}_{rh}^* = \frac{1}{\sqrt{2}}(\hat{i}_x - j\hat{i}_y)^*, \quad \text{and} \qquad (14)$$

$$\hat{i}_d = \hat{i}_{lh}^* = \frac{1}{\sqrt{2}}(\hat{i}_x + j\hat{i}_y)^*. \qquad (15)$$

The conjugate is used because the field to be shown would be the field received by an ideal circularly polarized antenna located at the far-field point. Note that to actually perform the dot product with these vectors, the far-field has to be transformed to a rectangular coordinate system.

Finally, co-polarized and cross-polarized fields for circular polarization can be determined through the use of the unit vectors, $$\hat{i}_d = \hat{i}_{co} = \frac{1}{\sqrt{2}}\{[\cos(\phi) + e^{-j\delta}\sin(\phi)]\hat{i}_\theta - [\sin(\phi) - e^{-j\delta}\cos(\phi)]\hat{i}_\phi\} \quad (16)$$

$$\hat{i}_d = \hat{i}_{cross} = \frac{1}{\sqrt{2}}\{[\cos(\phi) - e^{-j\delta}\sin(\phi)]\hat{i}_\theta - [\sin(\phi) + e^{-j\delta}\cos(\phi)]\hat{i}_\phi\}. \quad (17)$$

The sense of the polarization is selected using $\delta = \pi/2$ Left Handed Circular Polarization, and $\delta = -\pi/2$ Right Handed Circular Polarization.

While the invention has been described in combination with specific embodiments thereof, there are many alternatives, modifications, and variations that are likewise deemed to be within the scope thereof. Accordingly, the invention is intended to embrace all such alternatives, modifications and variations as fall within the spirit and scope of the appended claims.

What is claimed is:

1. A near-field probe station for use in scanning the near-field radiated power of a miniaturized printed circuit antenna, comprising:
   a coplanar waveguide ground-signal-ground microwave probe;
   a scanning probe;
   a mounting for the scanning probe, capable of moving said probe rotationally, and linearly along the x, y and z axis;
   a network analyzer and microwave receiver; and
   a computer for communicating with, and: controlling the movement of scanning probe in a predetermined data collection pattern over the antenna, and for processing data obtained from the analyzer and receiver.

2. The probe station according to claim 1, wherein the computer includes a software program for processing near-field power distribution data obtained from the analyzer and receiver, and for transforming the data into far-field distribution pattern.

3. The probe station according to claim 2, wherein the software program is capable of visually displaying three-dimensional contours of the far-field distribution pattern of the antenna.

4. The probe station according to claim 1, further including a DC probe for DC biasing of an active antenna.

5. The probe station according to claim 1, wherein the antenna is mounted on a platform using a vacuum system.

6. The probe station according to claim 5, wherein multiple antennas contained on a single semiconductor substrate are mounted on said platform.

7. The probe station according to claim 1 wherein the scanning probe is selected from the group consisting of an open ended waveguide probe and a dipole.

8. The probe station according to claim 1, further including visual magnification capabilities for facilitating the loading of the AUT on to a platform and for connecting the scanning probe to the AUT.

9. A process for conducting near-field pattern characterization of miniaturized AUT and for transforming the characterization into far-field data comprising the steps of:
   mounting the AUT on a platform that is substantially free of vibration;
   establishing a near-field data collection grid above the AUT;
   connecting an RF probe to the AUT;
   establishing a communication link between the RF probe and a scanning probe;
   applying an RF signal to the AUT;
   moving the scanning probe in a three-dimensional linear and rotational pattern along the grid to measure the output of the AUT at discrete points in the data collection grid, and
   collecting the radiated near-field data in response to the RF signal.

10. The process according to claim 9, further including the step of transforming the collected data to determine the far-field pattern of the AUT.

11. The process according to claim 9, further including applying a DC bias to the AUT through a DC probe before the step of moving the scanning probe.

12. The process according to claim 9, wherein the AUT has a cross section of about 1 cm or less.

13. The process according to claim 9, wherein the AUT is no larger than ½ lambda.

14. The process according to claim 9, wherein the AUT is mounted on the platform and is connected to the scanning probe with the aid of visual magnification means.

* * * * *